United States Patent
McCarron et al.

(10) Patent No.: US 11,223,342 B2
(45) Date of Patent: Jan. 11, 2022

(54) BULK ACOUSTIC WAVE SENSOR HAVING AN OVERMODED RESONATING STRUCTURE

(71) Applicant: QORVO US, INC., Greensboro, NC (US)

(72) Inventors: Kevin McCarron, Bend, OR (US); Rick Morton, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 202 days.

(21) Appl. No.: 16/466,724

(22) PCT Filed: Dec. 6, 2017

(86) PCT No.: PCT/US2017/064926
§ 371 (c)(1),
(2) Date: Jun. 5, 2019

(87) PCT Pub. No.: WO2018/106814
PCT Pub. Date: Jun. 14, 2018

(65) Prior Publication Data
US 2019/0341907 A1 Nov. 7, 2019

Related U.S. Application Data

(60) Provisional application No. 62/430,993, filed on Dec. 7, 2016.

(51) Int. Cl.
*H03H 9/17* (2006.01)
*G01N 29/02* (2006.01)
(Continued)

(52) U.S. Cl.
CPC ........... *H03H 9/175* (2013.01); *G01N 29/022* (2013.01); *G01N 29/036* (2013.01);
(Continued)

(58) Field of Classification Search
CPC ...... H03H 9/175; H03H 3/02; H03H 9/02078; H03H 2003/025; G01N 29/022;
(Continued)

(56) References Cited

U.S. PATENT DOCUMENTS

| 4,640,756 A | 2/1987 | Wang et al. |
| 9,219,517 B2 | 12/2015 | Aigner et al. |

(Continued)

FOREIGN PATENT DOCUMENTS

WO   WO 2016/130753 A1   8/2016

OTHER PUBLICATIONS

International Patent Application No. PCT/US2017/064926, filed Dec. 6, 2017; International Search Report & Written Opinion dated Mar. 6, 2018, 9 pages.

(Continued)

*Primary Examiner* — Herbert K Roberts
*Assistant Examiner* — John M Royston
(74) *Attorney, Agent, or Firm* — Mueting Raasch Group

(57) ABSTRACT

A bulk acoustic wave sensor includes a delay layer. The sensor includes an acoustic mirror and a base resonator. The base resonator includes a piezoelectric layer and two electrodes. One or more delay layers are disposed adjacent to the base resonator. A delay layer may be disposed between the base resonator and the acoustic mirror, a delay layer may be disposed on the base resonator opposite to the acoustic mirror, or both. Each delay section is formed of high quality-factor material. The sensor may define a resonant frequency, and the thickness of each delay section may be an integer multiple of half-wavelengths of the resonant frequency.

22 Claims, 18 Drawing Sheets

(51) Int. Cl.
*G01N 29/036* (2006.01)
*G01N 29/22* (2006.01)
*H03H 3/02* (2006.01)
*H03H 9/02* (2006.01)

(52) U.S. Cl.
CPC ............ *G01N 29/222* (2013.01); *H03H 3/02* (2013.01); *H03H 9/02078* (2013.01); *G01N 2291/0426* (2013.01); *H03H 2003/025* (2013.01)

(58) Field of Classification Search
CPC ............... G01N 29/036; G01N 29/222; G01N 2291/0426; G01N 2291/042; G01N 29/02
See application file for complete search history.

(56) References Cited

U.S. PATENT DOCUMENTS

| | | |
|---|---|---|
| 9,922,809 B2 | 3/2018 | McCarron et al. |
| 2004/0086872 A1 | 5/2004 | Childers et al. |
| 2013/0162369 A1 | 6/2013 | Wathen et al. |
| 2014/0333177 A1* | 11/2014 | Guillou .............. H03H 9/02102 310/321 |

OTHER PUBLICATIONS

Kline, et al., "Overmoded High Q Resonators for Microwave Oscillators," IEEE International Frequency Control Symposium, Salt Lake City, Utah, 1993, pp. 718-721.

Lakin, et al., "High Q Microwave Acoustic Resonators and Filters," Dec. 1993, *IEEE Transactions on Microwave Theory and Techniques*, (41)12:2139-2146.

* cited by examiner

BULK ACOUSTIC WAVE SENSOR HAVING AN OVERMODED RESONATING STRUCTURE

CROSS-REFERENCE TO RELATED APPLICATIONS

The present application is the § 371 U.S. National Stage of International Application No. PCT/US2017/064926, filed Dec. 6, 2017, which claims the benefit of U.S. Provisional Patent Application Ser. No. 62/430,993, filed Dec. 7, 2016, entitled "HIGH Q BAW SENSOR BASED ON AN OVERMODED DELAY SECTION," which is incorporated entirely herein by reference.

TECHNICAL FIELD

The present disclosure relates to bulk acoustic wave sensors and, in particular, relates to bulk acoustic wave sensors with overmoded resonating structures.

BACKGROUND

Fluidic devices having acoustic wave sensors for detecting the presence of an analyte in a sample often have biomolecules, such as antibodies or other proteins such as receptors, polynucleic acids, or the like attached to their surfaces. The analyte may bind to the biomolecule attached to the surface of the sensor and increase the mass bound to the sensor. The increased mass alters the wave propagation characteristics (e.g., magnitude, frequency, phase, etc.) of the sensor. The change in propagation characteristics due to analyte binding may be correlated with the amount of bound analyte and, thus, the amount of analyte in the sample.

The use of high Q resonators is often desirable when using a bulk acoustic resonator in sensing applications for which the basic function of the resonator is to sense mass via a change in operational frequency. This is the case for traditional quartz crystal monitors and for bulk acoustic wave (BAW) resonators based on thin-film technologies. Some conventional overmoded resonators use high quality-factor substrate beneath the resonator or a delay line between the electrodes to provide delay, such as those described in Kline, G. R., et al., "Overmoded High Q Resonators for Microwave Oscillators," 1993 IEEE International Frequency Control Symposium, Salt Lake City, Utah, 1993, pp. 718-721, and Lakin, K M, et al., "High Q Microwave Acoustic Resonators and Filters," IEEE Transactions on Microwave Theory and Techniques, Vol. 41, No. 12, December 1993, pp. 2139-2146, both of which are incorporated entirely herein by reference. However, using the substrate (such as, sapphire or quartz) for the delay layer typically requires very uniform substrate thickness and uniformity control, which may be difficult or expensive to manufacture.

The discussion of prior publications and other prior knowledge does not constitute an admission that such material was published, known, or part of the common general knowledge.

SUMMARY

In general, the present disclosure relates to a bulk acoustic wave (BAW) sensor having a resonating structure with a delay layer disposed adjacent to a base resonator which may enhance the overall quality factor (Q factor) of the resonating structure. In some embodiments, a delay layer may be disposed between a bottom electrode and an acoustic mirror, a delay layer disposed on a top electrode, or both. The one or more delay layers may be formed of high Q factor material. The sensor may define a resonant frequency, and the thickness of the delay layer may be an integer multiple of one half-wavelength of the resonant frequency.

One aspect of the present disclosure relates to a bulk acoustic wave sensor including an overmoded resonating structure. The resonating structure includes a base resonator having a piezoelectric layer, a first electrode disposed on a first surface of the piezoelectric layer, a second electrode disposed on a second surface of the piezoelectric layer opposite to the first side. The resonating structure also includes an acoustic delay layer adjacent to the base resonator. The resonating structure further includes an acoustic mirror layer adjacent to the base resonator or the acoustic delay layer.

One aspect of the present disclosure relates to a sensing system. The sensing system includes a microfluidic channel configured to receive a sample liquid. The sensing system also includes a bulk acoustic wave sensor having a surface that defines at least a portion of the microfluidic channel. The sensor includes a resonating structure. The resonating structure includes a base resonator having a first electrode, a second electrode, and a piezoelectric layer disposed between the electrodes. The resonating structure includes an acoustic delay layer disposed adjacent to the base resonator. The resonating structure includes an acoustic mirror layer disposed adjacent to the base resonator or the acoustic delay layer.

One aspect of the present disclosure relates to a thin-film method of making a resonating structure. The method includes providing a substrate; depositing an acoustic mirror layer on the substrate; and depositing an acoustic delay layer and a base resonator on the acoustic mirror layer in either order.

All scientific and technical terms used herein have meanings commonly used in the art unless otherwise specified. The definitions provided herein are to facilitate understanding of certain terms used frequently herein and are not meant to limit the scope of the present disclosure.

As used herein, the term "delay layer" may be used interchangeably with the terms "delay line" or "delay section."

The term "quality factor" (Q factor) of a resonator material refers to a dimensionless parameter that is a measure of the losses in the system, and can be defined as the ratio of the total energy in the system to the power lost in a half cycle, given by Equation A:

$$Q = \pi f \frac{E_{tot}}{\Delta E} \quad (A)$$

where f is the frequency, $E_{tot}$ is the total energy in the system and $\Delta E$ is the power lost in a half cycle. In general, higher Q factor indicates a low rate of energy loss relative to the stored energy of the resonator, so the oscillations may die out more slowly.

The term "high quality-factor" (high Q factor) refers to a low (for example, minimal) loss of power in the system. Therefore, the design of high quality-factor resonators is an exercise in lowering the losses in the system. The threshold for determining whether a Q factor is high may depend on the particular application as determined by one of ordinary skill in the art having the benefit of the present disclosure.

The term "coupling coefficient" ($K^2$) refers to a dimensionless parameter that characterizes the resonators effective electromechanical coupling coefficient. By definition, the effective coupling coefficient is given by Equation B:

$$K^2 = \frac{U_m^2}{U_e U_d} \quad (B)$$

where $U_m$ in the numerator describes how the electrical and mechanical domains couple, $U_e$ is the energy sored in the electrical domain, and $U_d$ is the energy stored in the mechanical domains. The extraction of Q and $K^2$ from the resonator's electrical performance are given by formulas described herein at Equations 4 and 5.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

DETAILED DESCRIPTION

Figure 1:
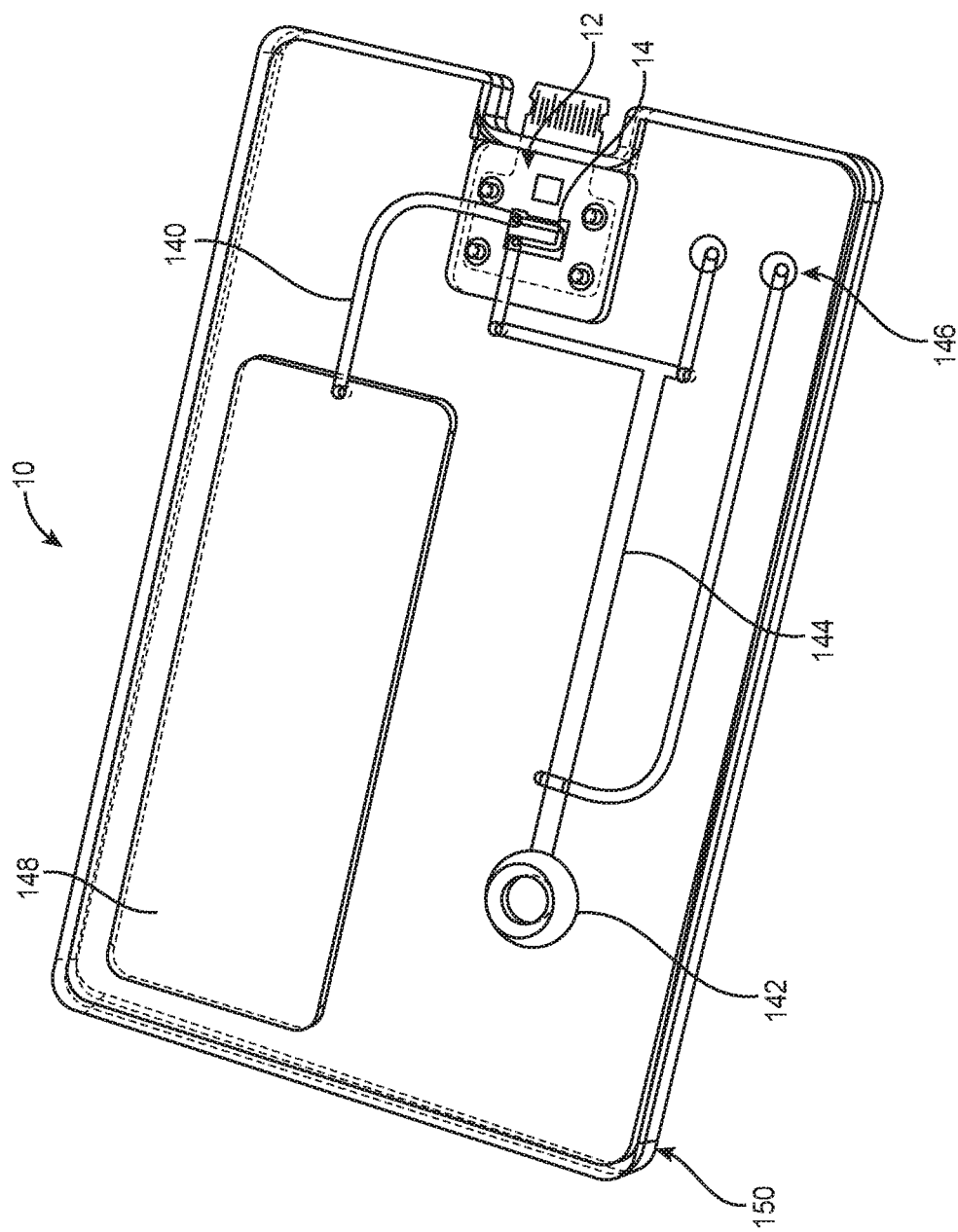
FIG. 1 is a perspective view of a sensing system according to one embodiment of the present disclosure.

This disclosure provides a resonating structure for a bulk acoustic wave (BAW) sensor having an acoustic delay layer. Although reference is made herein to fluid sampling measurements, such as an analyte concentration sensor in a microfluidic channel, the resonating structure may be used with any mass sensitive device utilizing resonator technology, even if not used for sampling measurements. In some embodiments, the resonating structure can be used to create resonators that operate in shear wave mode, which may be useful in liquid-based sensing applications, or that operate in longitudinal wave mode, which may be useful in solid mass or pressure-sensing applications. The sensing application may determine what particular mode (perhaps both) the sensor will operate. Various other applications, including non-sensing applications, will become apparent to one of skill in the art having the benefit of the present disclosure.

Conventional architectures for film or thin-film bulk acoustic resonators (FBARs or TFBARs, respectively) include using an air gap adjacent to or around the base resonator (for example, piezoelectric layer and electrodes) or using a Bragg acoustic mirror or reflector (for example, solid mounted resonators, or SMRs). In some embodiments, the structure of the present disclosure may be described as a new architecture for an FBAR or a TFBAR. The structure of the present disclosure includes a delay section of high Q factor material (low acoustic loss) placed adjacent to a base resonator including a piezoelectric layer and two electrodes. In some embodiments, a delay section may be disposed between the bottom electrode of the base resonator and the acoustic mirror or reflector that resides underneath, a delay section may be disposed on the top electrode of the base resonator, or both. This structure differs from some conventional structures in the placement of the delay section, the absence of an air gap between the base resonator and the substrate, or both.

This resonating structure may provide an overmoded resonator, with multiple resonance modes, which multiplies the Q factor due to interference of the waves that propagate through the resonator. Advantageously, the high Q factor may provide flexibility in designing BAW sensors. For example, the sensor may be designed to tradeoff between high Q factor and high coupling efficiency (K) depending on the particular requirements of a sensing application. The use of high Q resonators may be desirable when using a BAW sensor to sense mass via a change in operational frequency.

Advantageously, the resonating structure of the present disclosure can boost the Q factor of the resonator through Q multiplication, which may improve the sensing capabilities of the BAW sensor, particularly for highly sensitive sensing applications. In contrast to some conventional structures, this resonating structure may be fabricated entirely using standard thin-film deposition techniques that are known in the BAW and semiconductor industry (as opposed to using the substrate for the delay layer requiring very uniform substrate thickness and uniformity control).

In some embodiments, the sensors described herein are analytical devices that include a biomolecule and a transducer that converts an event of binding of a target to the biological molecule into an electrical signal. Certain devices involve a selective interaction between a biomolecule and a target. For example, the biomolecule may be a specific binding material (e.g., an antibody, a receptor, a ligand, etc.) and the target may a molecule, a protein, a DNA, a virus, a bacterium, etc. A binding event or a plurality of binding events between the specific binding material and the target may be converted into a measurable quantity by a transducer. In other embodiments, sensors may utilize a non-specific binding material capable of binding multiple types or classes of molecules or other moieties that may be present in a sample, such as may be useful in chemical sensing applications.

In some embodiments, the sensors are acoustic wave devices. An acoustic wave device employs an acoustic wave that propagates through or on the surface of a piezoelectric material, whereby changes to the characteristics of the propagation path affect the velocity and/or amplitude of the wave. Presence of a biomolecule on or over an active region of an acoustic wave device permits an analyte to be bound to the biomolecule, thereby altering the mass being vibrated by the acoustic wave and altering the wave propagation characteristics (e.g., velocity, thereby altering resonance frequency). Changes in velocity can be monitored by measuring the frequency, magnitude, or phase characteristics of the acoustic wave device and can be correlated to a physical quantity being measured.

The acoustic wave devices describe herein may include a piezoelectric crystal resonator as part of a resonating structure. With such devices, an acoustic wave may embody a bulk acoustic wave (BAW) propagating through the interior of a substrate.

BAW sensors typically involve transduction of an acoustic wave using electrodes arranged on opposing top and bottom surfaces of a piezoelectric material. In a BAW sensor, three wave modes may propagate, namely, one longitudinal mode (embodying longitudinal waves, also called compressional/extensional waves), and two shear modes (embodying shear waves, also called transverse waves), with longitudinal and shear modes respectively identifying vibrations where particle motion is parallel to or perpendicular to the direction of wave propagation. The longitudinal mode is characterized by compression and elongation in the direction of the propagation, whereas the shear modes consist of motion perpendicular to the direction of propagation with no local change of volume. Longitudinal and shear modes propagate at different velocities. In practice, these modes are not necessarily pure modes as the particle vibration, or polarization, is neither purely parallel nor purely perpendicular to the propagation direction. The propagation characteristics of the respective modes depend on the material properties and propagation direction respective to the crystal axis orientations. The ability to create shear displacements is beneficial for operation of acoustic wave devices with fluids (e.g., liquids) because shear waves do not impart significant energy into fluids. BAW sensors include bulk acoustic resonators deposited on one or more reflective layers, such as Bragg mirror, and film bulk acoustic resonators having an air-gap.

The sensor described herein may employ any suitable piezoelectric thin film. Certain piezoelectric thin films are capable of exciting both longitudinal and shear mode resonance, such as hexagonal crystal structure piezoelectric materials including (but not limited to) aluminum nitride and zinc oxide. To excite a wave including a shear mode using a piezoelectric material layer arranged between electrodes, a polarization axis in a piezoelectric thin film is generally non-perpendicular to (e.g., tilted relative to) the film plane. In sensing applications involving liquid media, the shear component of the resonator may be used. In such applications, piezoelectric material may be grown with a c-axis orientation distribution that is non-perpendicular relative to a face of an underlying substrate to enable a BAW resonating structure to exhibit a dominant shear response upon application of an alternating current signal across electrodes thereof. Conversely, a piezoelectric material grown with a c-axis orientation that is perpendicular relative to a face of an underlying substrate will exhibit a dominant longitudinal response upon application of an alternating current signal across electrodes thereof.

Reference will now be made to the drawings, which depict one or more aspects described in this disclosure. However, it will be understood that other aspects not depicted in the drawings fall within the scope of this disclosure. Like numbers used in the figures refer to like components, steps and the like. However, it will be understood that the use of a reference character to refer to an element in a given figure is not intended to limit the element in another figure labeled with the same reference character. In addition, the use of different reference characters to refer to elements in different figures is not intended to indicate that the differently referenced elements cannot be the same or similar.

FIG. 1 shows a sensing system 10 (for example, a cartridge) having a die 12 (for example, sensor die) housing a microfluidic channel 14. The sensing system 10 may include or be operatively coupled to a detection platform to receive resonator data. The detection platform may be removably coupled to the sensing system 10.

The microfluidic channel 14 may be configured to receive a sample liquid. Die 12 may be coupled to a sensor platform 150 to fluidly couple the channel 14 to a fluid flow path 140 housed in the sensor platform. The fluid flow path 140 may extend from a sample port 142 to a waste chamber 148. A sample fluid may be injected into the sample port 142 in fluid communication with a sample reservoir 144 along the fluid flow path 140. The sample fluid may contain a target material (analyte). The sample reservoir 144 may have a hydrophilic surface to draw the sample fluid into the reservoir. Sample handling fluid, such as buffer solution or complex matrix, may be injected into handling fluid ports 146 in fluid communication with the sample reservoir 144. The sample handling fluid may be used to push the sample fluid through the sample reservoir 144 toward the channel 14 of the die 12. Sample fluid may flow through the channel 14 to the waste chamber 148. As sample fluid passes through or resides in the channel 14 of the die 12, the presence of target material in the sample fluid may be measured. The die 12 may be operatively coupled to an external detection platform (not shown) to further analyze measurement data. A complex matrix may include biological fluid, such as urine, blood, serum, plasma, or saliva.

Figure 2:
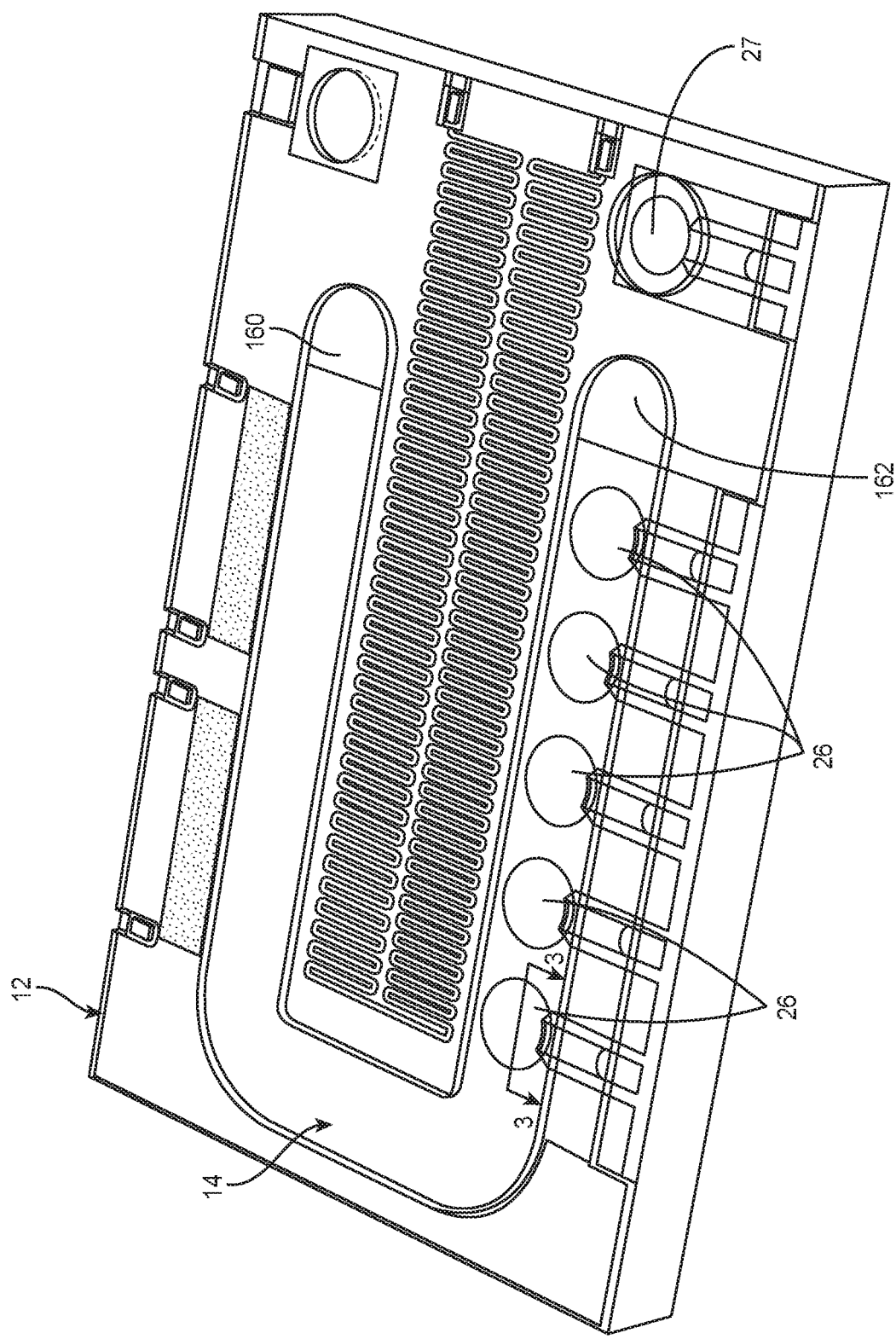
FIG. 2 is a perspective view of a sensor die of the sensing system of FIG. 1.

FIG. 2 shows the die 12 housing the microfluidic channel 14 and a plurality of resonators 26 disposed along the channel. The resonators 26 may be arranged in series, in parallel, or a combination of both along the channel 14. The resonators 26 may be exposed to the channel 14 to allow any fluid in the channel to flow over the resonators. One or more of the resonators 26 may be sensing resonators including specific binding material on a surface to bind target material. One or more of the resonators 26 may be reference resonators. A reference resonator may include non-specific binding material on a surface. The non-specific binding material may be similar to the specific binding material (for example, an antibody) but bind to a non-target material, which may be unlikely to be found in sample fluid. The non-specific binding material may be selected based on the particle size of the non-target material that binds to the non-specific binding material being similar to the particle size of the target material. A reference resonator may include non-functionalized binding material, such as silane, that may not bind to any material in the sample fluid.

The die 12 may include a remote reference resonator 27. The remote reference resonator 27 may be acoustically coupled to a different type of fluid than the sample fluid. For example, the remote reference resonator 27 may be acoustically coupled to air.

Walls of the microfluidic channel 14 may be formed of any suitable material, such as laser-cut "stencil" layers of thin polymeric materials and/or laminate materials, optionally including one or more self-adhesive surfaces (for example, adhesive tape). Optionally such walls may be formed prior to deposition of a self-assembled monolayer (SAM), functionalization material, and/or blocking layers. The walls may be made with a SU-8 negative epoxy resist or other photoresist material. In certain embodiments, a cover or cap layer may be integrally formed with one or more walls (for example, via molding or another suitable process) to define a portion of an upper boundary as well as lateral boundaries of at least one fluidic channel, and the integrally formed partial cover-and-wall structure may be applied (for example, adhered or otherwise bonded) to enclose the at least one fluidic channel.

The channel 14 may extend a length from a proximal end portion (for example, upstream port 160) to a distal end portion 162 (for example, downstream port 162). In general, sample fluid may enter the channel 14 in the upstream port 160 and leave the channel in the downstream port 162. However, the fluid flow may be modulated, for example, stalled or even reversed in some cases. When the die 12 is coupled to the sensing platform 150 (FIG. 1), the upstream port 160 may be in fluid communication with the sample port 142 (FIG. 1) and the downstream port 162 may be in fluid communication with the waste chamber 148 (FIG. 1). The channel 14 may extend parallel to a plane or be described as planar. The channel 14 may have a U-shape.

Figure 3:
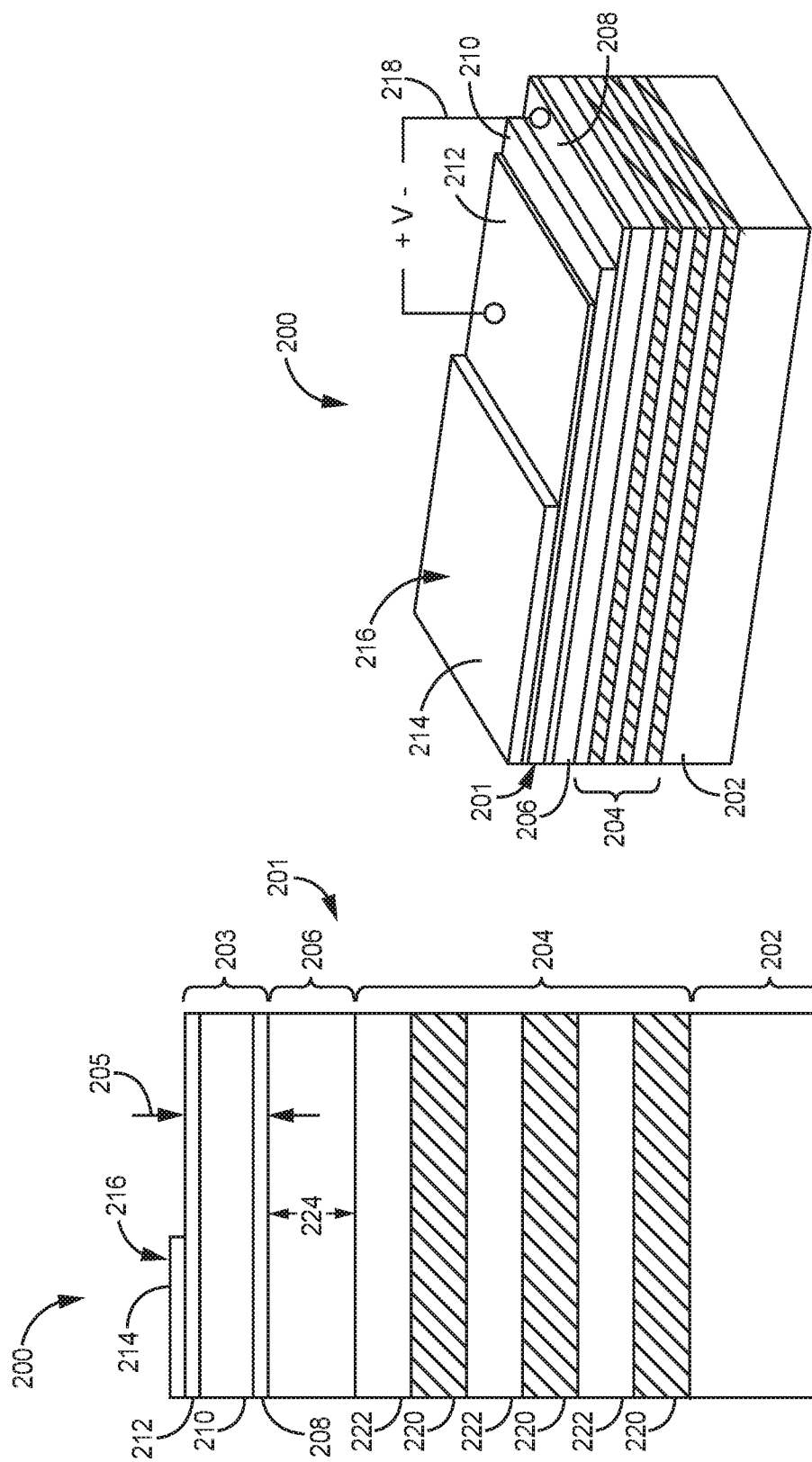
FIG. 3A is a cross-sectional view at line 3-3 (FIG. 2) of a bulk acoustic wave sensor of the die of FIG. 2 showing a delay layer.
FIG. 3B is a perspective view of the bulk acoustic wave sensor of FIG. 3A.

FIGS. 3A and 3B show a portion of a bulk acoustic wave (BAW) sensor 200, which includes a resonating structure 201, in particular an overmoded resonating structure, disposed on a substrate 202. FIG. 3A is a view along cross-sectional line 3-3 (FIG. 2). For illustrative purposes, portions of some of the layers are removed in FIG. 3B.

In the illustrated embodiment, the resonating structure 201 of the sensor 200 includes an acoustic mirror layer 204 (for example, an acoustic reflector), an acoustic delay layer 206 disposed on the mirror layer 204, a first electrode 208 (for example, a bottom electrode) disposed on the acoustic delay layer 206, a piezoelectric layer 210 disposed on the first electrode 208, a second electrode 212 (for example, a top electrode) disposed on the piezoelectric layer, and an insulating layer 214 disposed on the second electrode. The piezoelectric layer 210 may be formed of a piezoelectric transducer, which may operate in a shear wave mode or a longitudinal wave mode.

In some embodiments, the substrate 202 may not be considered part of the resonating structure 201 because the substrate may not affect the resonance properties of the sensor 200. However, in some embodiments, the substrate 202 may be considered part of the resonating structure 201.

The substrate 202 may be disposed adjacent to the acoustic mirror layer 204, opposite to the acoustic delay layer 206. The substrate 202 may be formed of any suitable material upon which layers can be disposed. In some embodiments, the substrate 202 is formed of a semiconductor material. For example, the substrate 202 may be formed of silicon (Si) or another semiconductor wafer material, such as gallium arsenide (GaAs). In some embodiments, the substrate 202 is formed of a non-semiconductor material. For example, the substrate 202 may be formed of alumina or sapphire.

A base resonator 203 includes the first electrode 208, the piezoelectric layer 210, and the second electrode 212. The acoustic delay layer 206 may be described as being adjacent to the base resonator 203. The acoustic delay layer 206 is not disposed between the electrodes 208, 212 or disposed between the piezoelectric layer 210 and either electrode 208, 212. In the illustrated embodiment, the acoustic delay layer 206 is disposed between the acoustic mirror layer 204 and the base resonator 203.

The acoustic mirror layer 204 may be disposed beneath the delay layer 206. The delay layer 206 may be in direct contact with the mirror layer 204, the first electrode 208, or both.

The delay layer 206 may include a high quality-factor material with low acoustic loss. Non-limiting examples of high quality-factor materials include: aluminum oxide ($Al_2O_3$), aluminum nitride (AlN), zinc oxide (ZnO), silicon carbide (SiC), silicon dioxide ($SiO_2$), and carbon (C). Aluminum oxide may include alumina or sapphire. Silicon dioxide may include quartz. Carbon may include diamond.

The delay layer 206 may define a delay layer thickness 224 configured to provide multiple resonance modes in the resonating structure 201. In other words, the delay layer 206 may provide a volume where acoustic waves can reflect between the base resonator 203 and the acoustic mirror layer 204. The delay layer 206 may be made from a thin-film process or other processes. Other processes may be more suitable for producing thick delay layers 206, for example, that are multiple half-wavelengths. Further, other processes may be more suitable for certain materials, such as sapphire, which may be impractical to use in a thin-film process as the delay layer 206.

The resonating structure 201 may define a base resonator thickness 205 equal to about one-half of a predetermined wavelength, or one half-wavelength. The base resonator 203 may be defined by the electrodes 208, 212 and the piezoelectric layer 210. The base resonator thickness 205 may be equal to the distance between the top of the second electrode 212 and the bottom of the first electrode 208, or in other words, the distance between the furthest surfaces of the electrodes 208, 212. The delay layer thickness 224 may be equal to a non-negative integer multiple of the half-wavelength. In some embodiments, the delay layer thickness 224 may be equal to only about one half-wavelength. In some embodiments, the delay layer thickness 224 be equal to at least about 3 half-wavelengths, at least about 5 half-wavelengths, or even at least about 10 half-wavelengths. Further, in some embodiments, the delay layer thickness 224 is equal to at least about 150, at least about 200, or even at least about 250 half-wavelengths.

The acoustic mirror layer 204 serves to reflect acoustic waves and therefore reduce or avoid their dissipation in the substrate 202. The acoustic mirror layer 204 may include alternating layers of different material. The acoustic mirror layer 204 may include a first layer 220 and a second layer 222, which alternate to form the acoustic mirror. In some embodiments, the first and second layers 220, 222 are alternating thin layers of materials having different acoustic impedance values, optionally embodied in a quarter-wave Bragg mirror, deposited over the substrate 202. Non-limiting examples of materials used in the layers 220, 222 include: silicon oxicarbide (SiOC), silicon nitride ($Si_3N_4$), silicon dioxide (SiO$_2$), aluminum nitride (AlN), tungsten (W), and molybdenum (Mo). For example, the first layer 220 may be formed of aluminum nitride and the second layer may be formed of tungsten. In some embodiments, other types of acoustic reflectors may be used.

The sensor 200 may have a surface that defines at least a portion of the microfluidic channel 14 (FIG. 1). For example, the surface 216 of the insulating layer 214 may define at least a portion of the channel 14.

The resonating structure 201 of the sensor 200 may be formed using any suitable method. In some embodiments, the resonating structure 201 is formed using a thin-film technique, such as thin-film deposition that allows layers of nanometer to several micrometer thickness to be formed.

In one thin-film technique, the substrate 202 may be provided. The acoustic mirror layer 204 may be deposited onto the substrate 202. The acoustic delay layer 206 may be disposed onto the acoustic mirror layer 204. A first electrode 208 may be deposited on the acoustic delay layer 206. Further, the piezoelectric layer 210 may be grown (for example, via sputtering or other appropriate methods) on the first electrode 208. The second electrode 212 may be deposited on the piezoelectric layer 210. Some methods for forming acoustic wave sensors are disclosed in U.S. Patent Application Publication 2017/0294892, published Oct. 12, 2017, which is incorporated entirely herein by reference.

In certain embodiments, the piezoelectric layer 210 has a hexagonal crystal structure piezoelectric material (for example, AlN or ZnO) that includes a c-axis having an orientation distribution that is predominantly non-parallel (and may also be non-perpendicular to) to normal of a face of the substrate 202. Under appropriate conditions, presence of a c-axis having an orientation distribution that is predominantly non-parallel to normal of a face of a substrate enables a BAW resonating structure to be configured to exhibit a dominant shear response upon application of an alternating current signal across a distal electrode and a proximal electrode thereof (for example, as may be desirable in the context of a BAW resonating structure providing sensing utility). Some methods for forming hexagonal crystal structure piezoelectric materials including a c-axis having an orientation distribution that is predominantly non-parallel to normal of a face of a substrate are disclosed in U.S. patent application Ser. No. 15/293,063 filed on Oct. 13, 2016, which is incorporated entirely herein by reference. Some additional methods for forming piezoelectric materials having an inclined c-axis orientation are disclosed in U.S. Pat. No. 4,640,756 issued on Feb. 3, 1987, which is incorporated entirely herein by reference.

The second electrode 212 of the resonating structure 201 may be overlaid with various layers, such as one or more of: a hermeticity layer, an interface layer, a self-assembled monolayer (SAM), and/or a functionalization material layer (which may include specific binding material or non-specific binding material). In some embodiments, the second electrode 212 is overlaid with the insulating layer 214.

Any suitable method may be used to dispose the insulating layer 214 onto the second electrode 212 of the resonating structure 201. Typically, atomic layer deposition (ALD) may be used to deposit the insulating layer 214, which may provide superior thickness control and conformal coverage compared to other techniques. By using ALD, thinner layers can be used, which may improve the performance of the resonating structure 201 by not loading it excessively. In cases where excessive loading is not a concern, the insulating layer 214 may be be deposited using conventional plasma assisted chemical vapor deposition (PCVD) or physical vapor deposition (PVD).

The insulating layer 214 may electrically insulate the rest of the resonating structure 201 from fluids in the microfluidic channel 14 (FIG. 1). For example, the insulating layer 214 may be disposed the channel 14 and the second electrode 212.

The insulating layer 214 may also be described as a functionalization layer. In particular, the insulating layer 214 may have a functionalized material disposed on the surface 216. The insulating layer 214 may be functionalized to bind with one or more analytes that may be present in a fluid sample.

The resonating structure 201 may be described as an overmoded resonator. An overmoded resonator may have various properties, which may be calculated according to Equations 1 to 6.

In an overmoded resonator, multiple resonances occur at frequencies that are multiples of the fundamental frequency of the entire structure. This frequency spacing is inversely proportional to the thickness of the delay layer. The resonant frequency of any mode may be calculated according to Equation 1, in which $f_m$ is the resonant frequency of a mode, m is the mode number, and $f_{spacing}$ is the frequency spacing between modes.

$$f_m = m * f_{spacing} \quad (1)$$

Conversely, the mode number may be calculated according to Equation 2.

$$m = f_m / f_{spacing} \quad (2)$$

The mode number can alternatively be calculated according to Equation 3 in terms of the delay layer thickness 224 ($t_{delay}$) which is measured in fractional units of the number of wavelengths (0.5λ, 1λ, 1.5λ, etc), and therefore dependent on the frequency of operation.

$$m = 2 * t_{delay} + 2 \quad (3)$$

The Q factor of the resonating structure may be calculated according Equation 4, where $\varphi_z$ is the phase of the impedance.

$$Q = \frac{f_m}{2} \frac{d\varphi_z}{df} \quad (4)$$

The coupling coefficient $K^2$ of the resonator may be calculated according to Equation 5.

$$K^2 = \frac{\pi}{2} \cdot \frac{f_s}{f_p} \cdot \cot \frac{\pi}{2} \cdot \frac{f_s}{f_p} \quad (5)$$

In some embodiments, the delay layer thickness 224 ($t_{delay}$) may provide an ideal Q multiplier factor of at least about 2, at least about 3, at least about 4, at least about 5, at least about 6, at least about 7, at least about 8, at least about 9, or even at least about 10.

In some embodiments, the delay layer thickness 224 ($t_{delay}$) may be any value represented by Equation 6, where n is a non-negative integer.

$$t_{delay} = (n+1) * \frac{\lambda}{2} \quad \text{where } n = 0, 1, 2, \ldots \quad (6)$$

Figure 14:
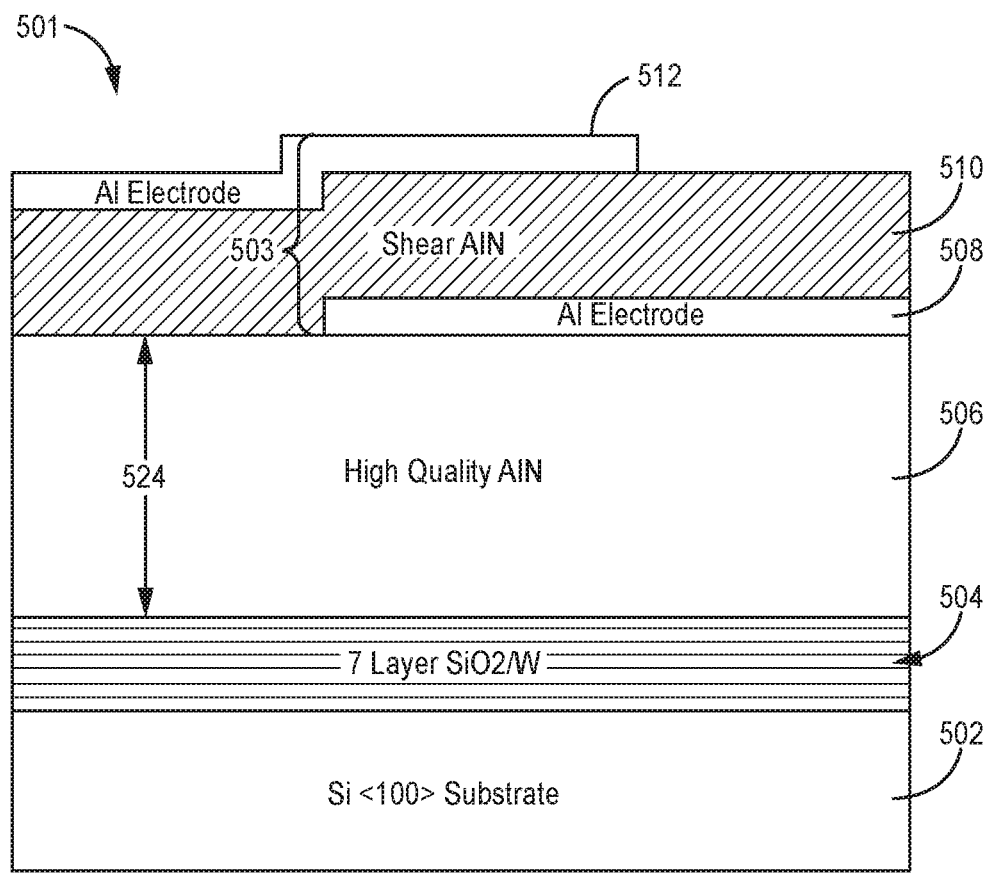
FIG. 14 is a cross-sectional view of a resonating structure according to one embodiment of the present disclosure.
Figure 15:
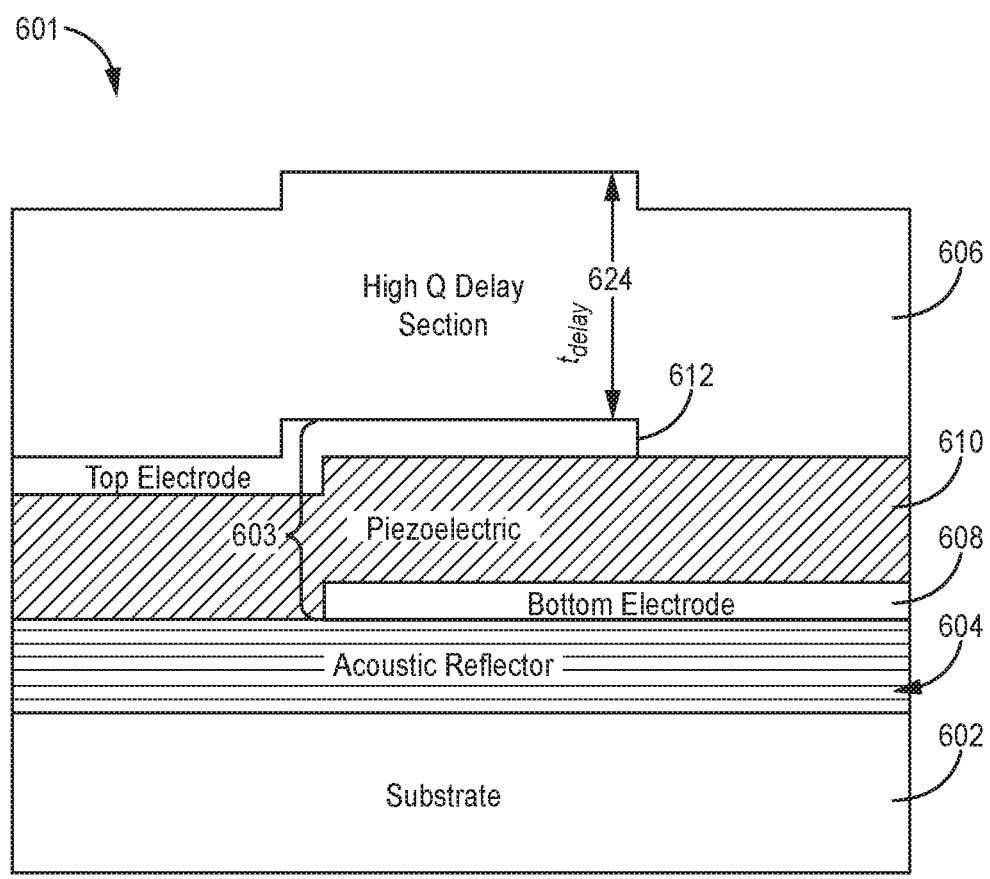
FIG. 15 is a cross-sectional view of a resonating structure according to another embodiment of the present disclosure.
Figure 16:
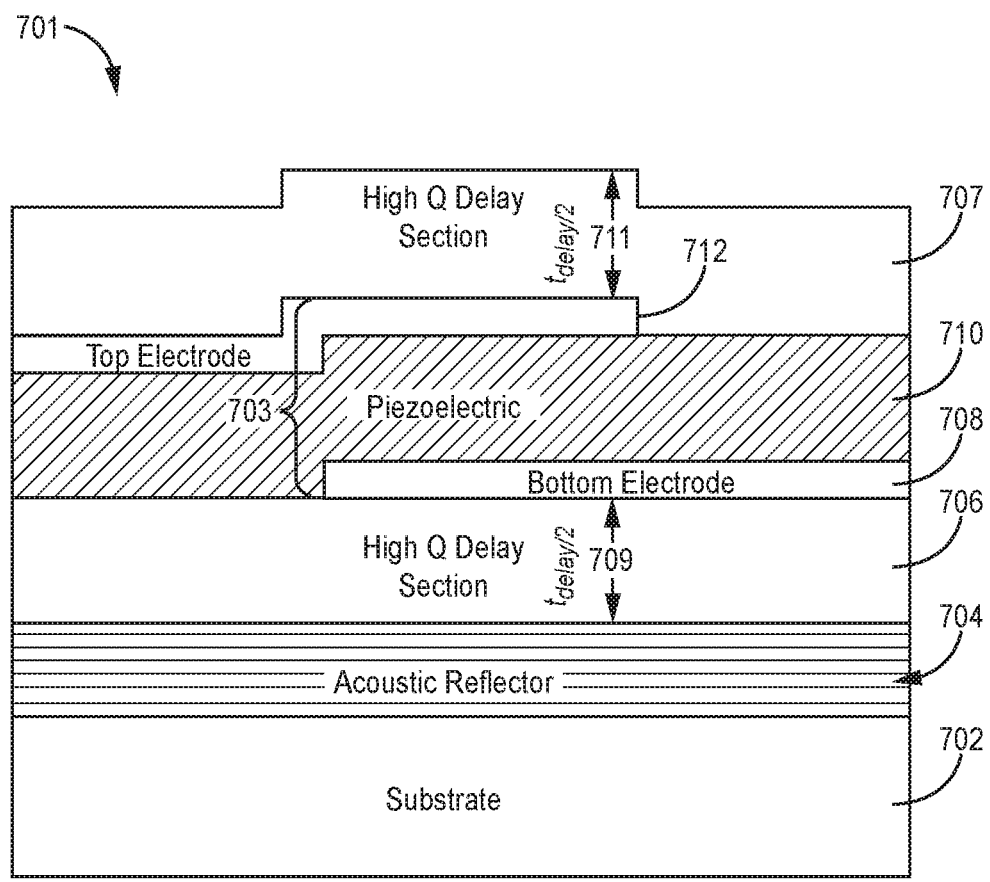
FIG. 16 is a cross-sectional view of a resonating structure according to yet another embodiment of the present disclosure.

FIGS. 14, 15, and 16 show variations on the resonating structure 201 (FIGS. 3A-B), which may be used in various sensors of the present disclosure. The resonating structures 501, 601, and 701 are similar to resonating structure 201 except where described differently herein.

In particular, FIG. 14 shows the resonating structure 501 having a substrate 502, an acoustic mirror layer 504, an acoustic delay layer 506, a bottom electrode 508, a piezoelectric layer 510, and a top electrode 512. A base resonator 503 is formed from the piezoelectric layer 510 and the electrodes 508, 512. In particular, the base resonator 503 may be defined only in a region where the electrodes 508, 512 overlap. The acoustic delay layer 506 is disposed adjacent to the base resonator 503. In particular, the acoustic delay layer 506 is disposed between the base resonator 503 and the acoustic mirror layer 504. The acoustic delay layer 506 has a delay layer thickness 524, which may be similar to the delay layer thickness 224 (FIG. 3A).

The electrodes 508, 512 may not entirely cover the surfaces of the piezoelectric layer 510. In the illustrated embodiment, the electrodes 508, 512 are formed of aluminum, the piezoelectric layer 510 is formed of aluminum nitride, the acoustic mirror layer 504 is formed of alternating layers of silicon dioxide and tungsten with 7 layers total, and the substrate 502 is formed of silicon.

FIG. 15 shows the resonating structure 601 having a substrate 602, an acoustic mirror layer 604, an acoustic delay layer 606, a bottom electrode 608, a piezoelectric layer 610, and a top electrode 612. A base resonator 603 is formed from the piezoelectric layer 610 and the electrodes 608, 612, particularly where the electrodes overlap. This resonating structure 601 differs from resonating structure 501 in that the acoustic delay layer 606 is disposed adjacent to the top electrode 612 instead of between the base resonator 603 and the acoustic reflector 604. In the illustrated embodiment, the acoustic delay layer 606 forms a top of the resonating structure 601 and is disposed on the top electrode 612 and the piezoelectric layer 610. The acoustic delay layer 606 has a delay layer thickness 624, which may be similar to the delay layer thickness 224 (FIG. 3A) or thickness 524 (FIG. 14). The materials used may be the same as used in resonator 501.

FIG. 16 shows the resonating structure 701 having a substrate 702, an acoustic mirror layer 704, a first acoustic delay layer 706, a second acoustic delay layer 707, a bottom electrode 708, a piezoelectric layer 710, and a top electrode 712. A base resonator 703 is formed from the piezoelectric layer 710 and the electrodes 708, 712, particularly where the electrodes overlap. This resonating structure 701 differs from resonating structures 501, 601 in that there are two acoustic delay layers 706, 707. Both acoustic delay layers 706, 707 are disposed adjacent to the base resonator 703 on opposite sides. In the illustrated embodiment, the first acoustic delay layer 706 is disposed between the base resonator 703 and the acoustic mirror layer 704, and the second acoustic delay layer 707 is disposed on the top electrode 712 and the piezoelectric layer 710. The materials used may be the same as used in resonator 501.

The first acoustic delay layer 706 may have a first partial delay layer thickness 709 and the second acoustic delay layer 707 may have a second partial delay layer thickness 711. The sum of the partial delay layer thicknesses 709, 711 may equal a full or total delay layer thickness, such as delay layer thickness 224 (FIG. 3A), thickness 524 (FIG. 14), or thickness 624 (FIG. 15). For example, each acoustic delay layer 706, 707 may have a thickness equal to half of the thickness of delay layer 506, 606.

In some embodiments, when each partial delay layer thickness 709, 711 is equal to half of the full delay layer thickness, the full delay layer thickness may be limited to non-negative integer multiples of one full-wavelength of the resonant frequency instead of one half-wavelength in other embodiments. This will allow each partial delay layer thickness 709, 711 to follow Equation 6 and be equal to a non-negative integer multiple of one half-wavelength of the resonant frequency.

While the present disclosure is not so limited, an appreciation of various aspects of the disclosure will be gained through a discussion of the specific examples and illustrative embodiments provided below, which provide alloys with superior mechanical and corrosion properties. Various modifications of the examples and illustrative embodiments, as well as additional embodiments of the disclosure, will become apparent herein.

EXAMPLES

The effect that the thickness of the delay layer has on the obtainable Q and coupling coefficient $K^2$ of the sensor was studied using Mason model simulations for both longitudinal and shear wave components at a series resonance, which is represented as a normalized frequency equal to 1.0, for various structures. The delay layer thickness ($t_{delay}$) of the resonating structures were varied by amounts of at least ½. Overall, delay layer thicknesses of 0, 0.5λ, 1.5λ, 2λ, 5λ, and 10λ were studied. The Q factor was analyzed at a constant frequency of series resonance at normalized frequency equal to 1.0. The shear wave mode was analyzed, which may be relevant to the longitudinal wave mode, too. The final frequency response was a superposition of both modes.

The model assumed no losses in the delay layer and no surface loss effects.

Example 1

In Example 1, a resonating structure was modeled according to resonating structure 501 of FIG. 14. The model was generated based on an aluminum nitride for the piezoelectric layer 510 placed between aluminum electrodes 508, 512. Aluminum nitride for the delay layer 506 placed directly beneath the bottom electrode 508. Underneath the delay layer 506, a seven-layer silicon dioxide-tungsten reflector stack forming an acoustic mirror layer 504 was placed. The acoustic mirror layer 504 was placed on top of a semi-insulating silicon substrate 502. The proposed delay layer technique could be used for a wide variety of materials and can be fabricated using conventional thin film deposition and film bonding (wafer bonding) techniques.

Figure 4:
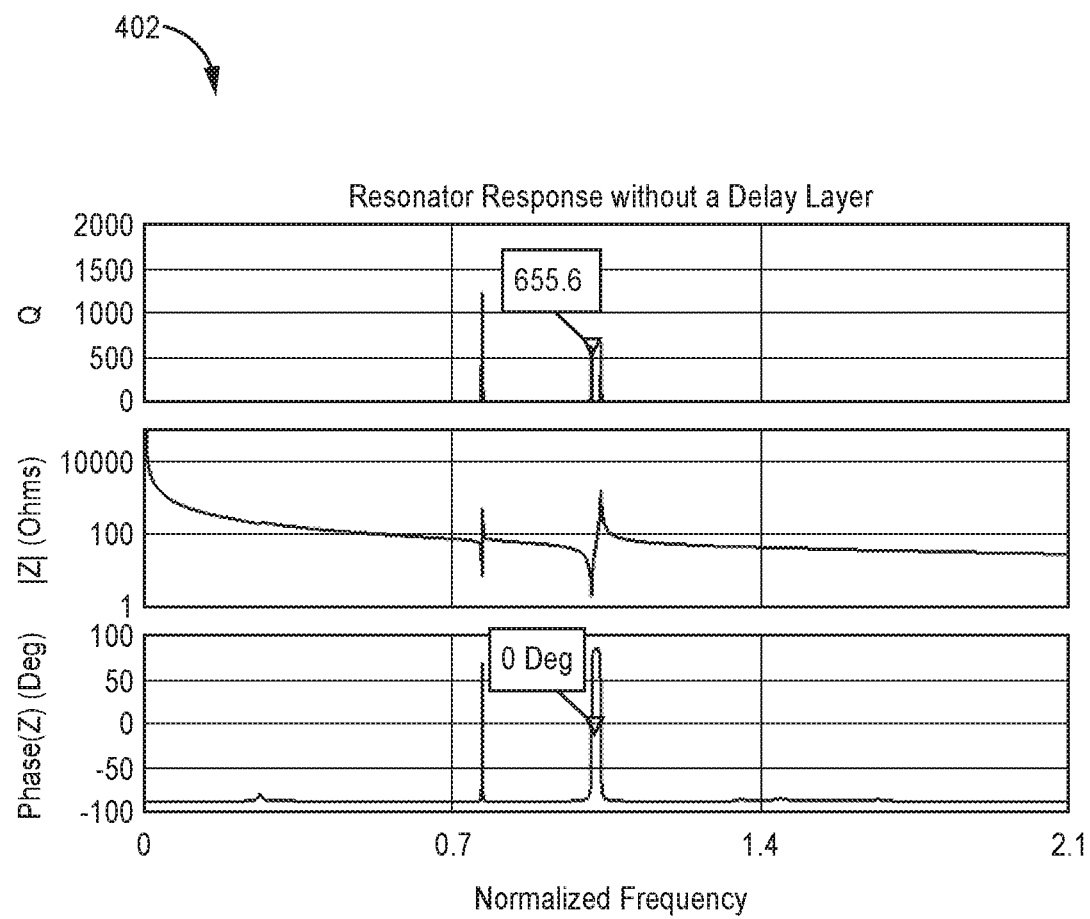
FIG. 4 is a graph of a resonator response on a normalized scale for a structure without a delay layer ($t_{delay}=0$).
Figure 5:
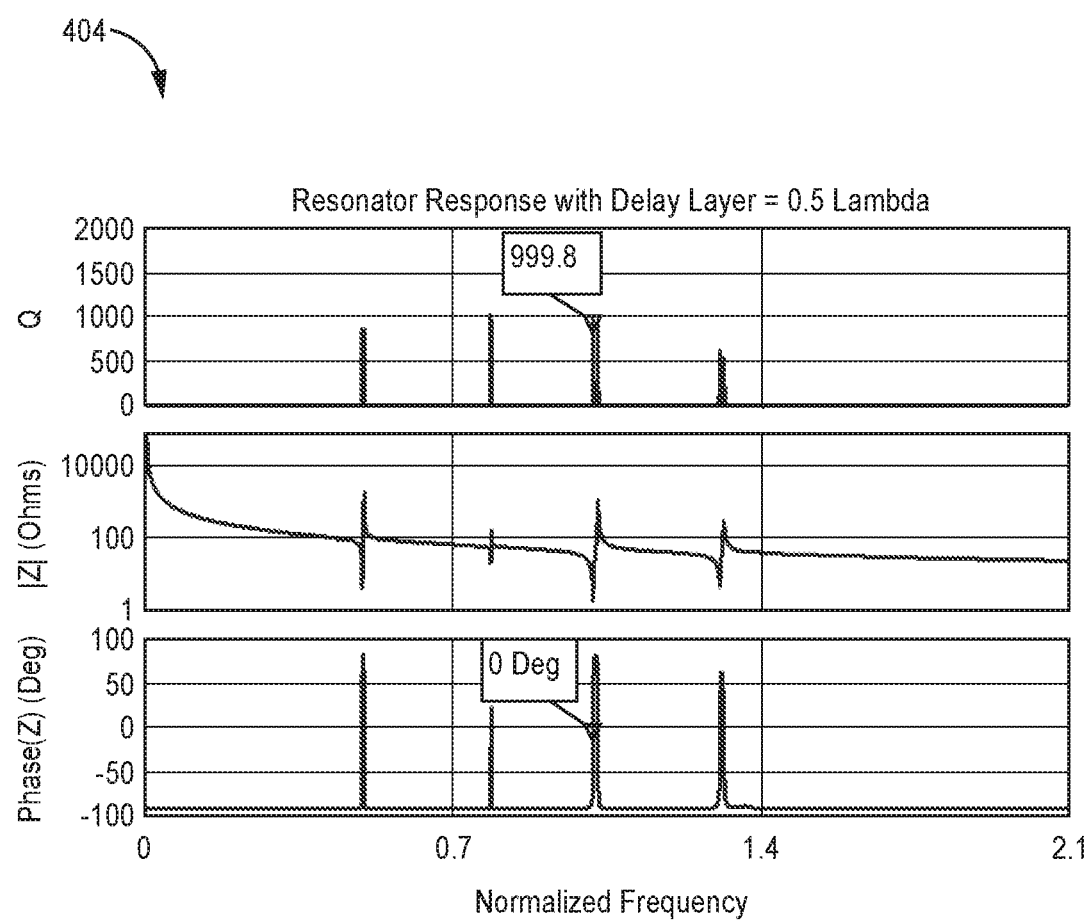
FIG. 5 is a graph of a resonator response on a normalized scale with $t_{delay}=0.5\lambda$.
Figure 6:
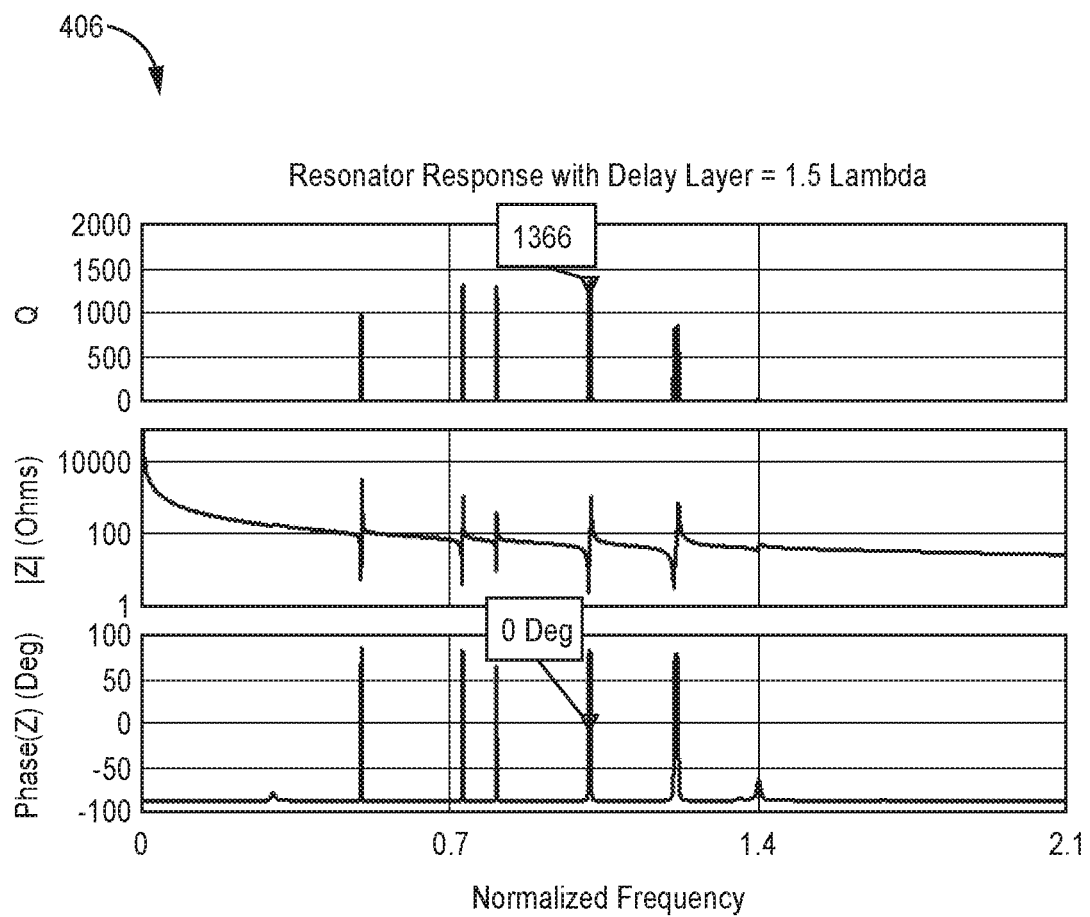
FIG. 6 is a graph of a resonator response on a normalized scale with $t_{delay}=1.5\lambda$.
Figure 7:
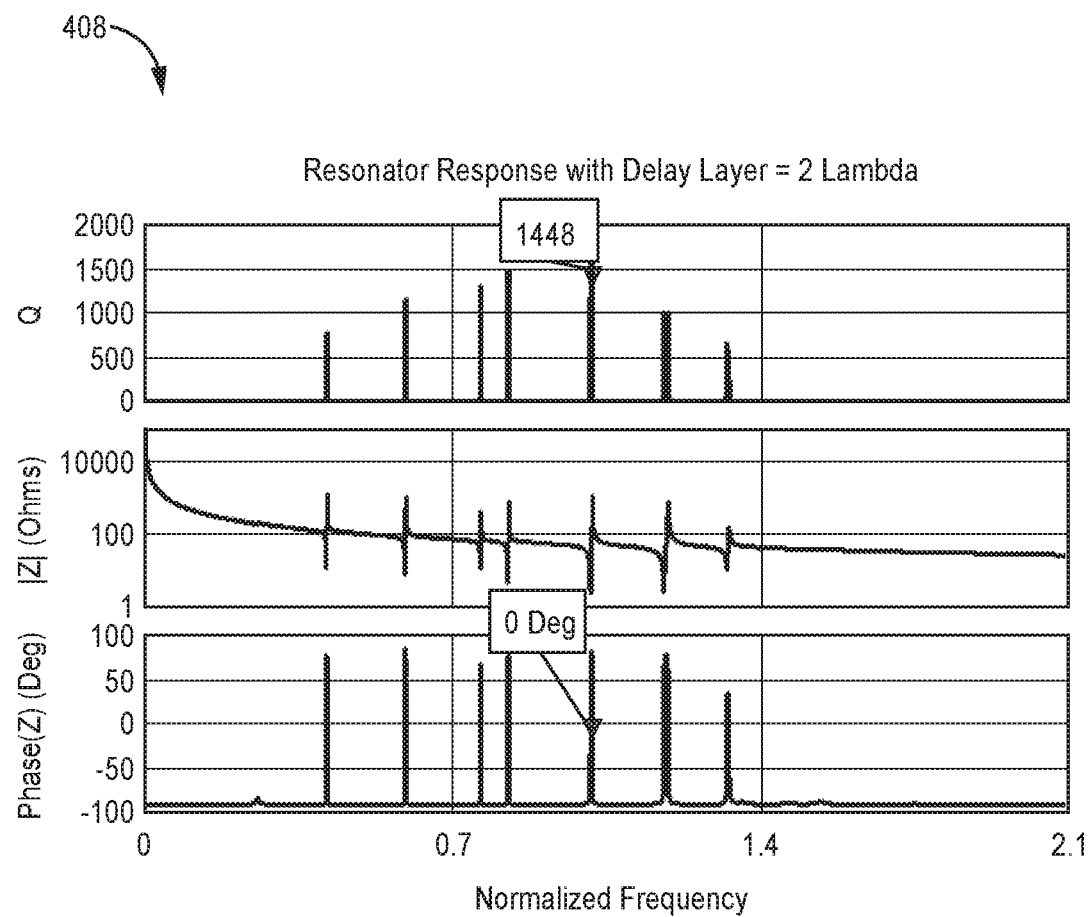
FIG. 7 is a graph of a resonator response on a normalized scale with $t_{delay}=2\lambda$.
Figure 8:
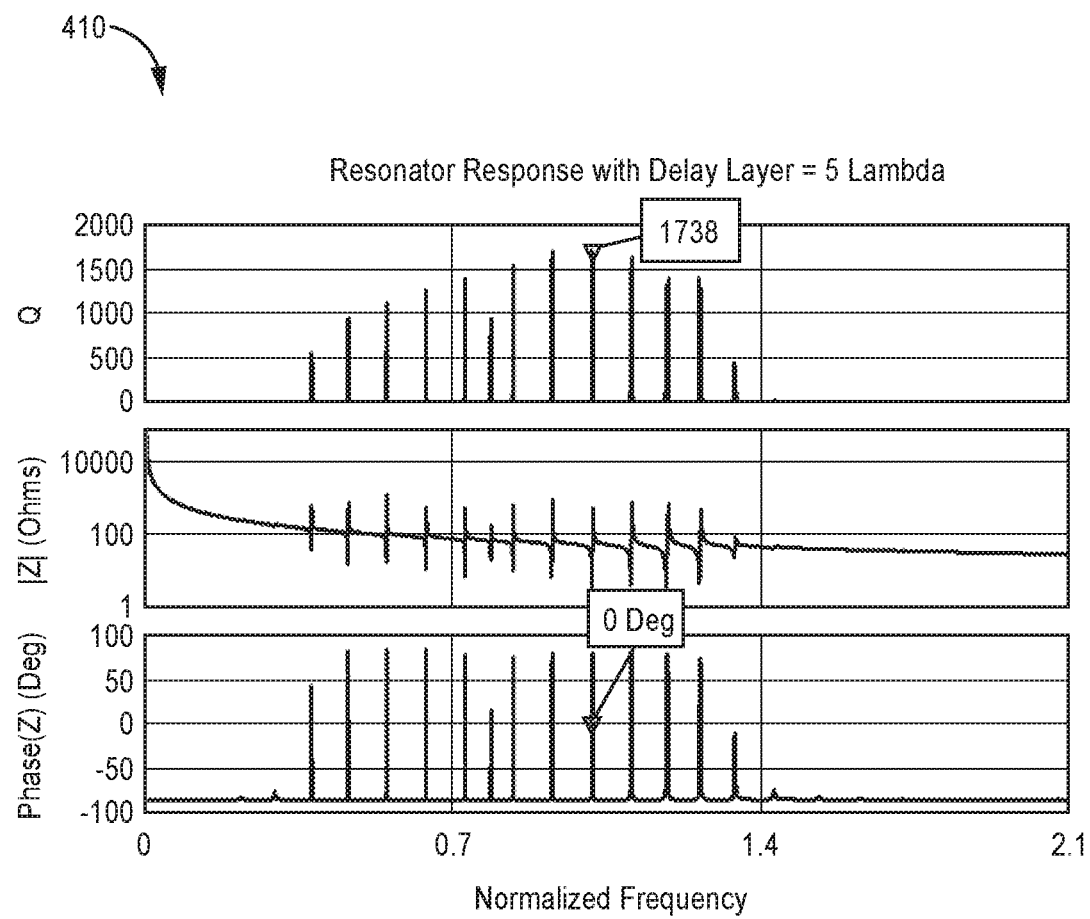
FIG. 8 is a graph of a resonator response on a normalized scale with $t_{delay}=5\lambda$.
Figure 9:
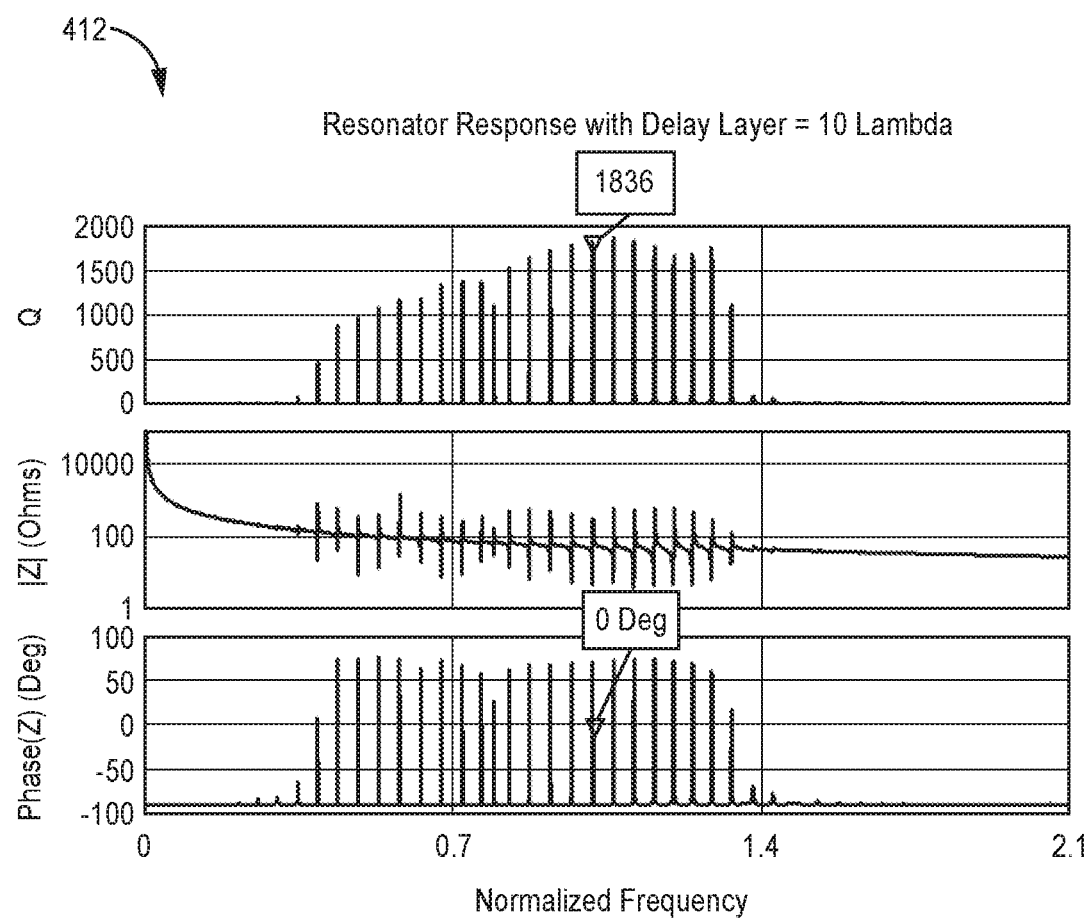
FIG. 9 is a graph of a resonator response on a normalized scale with $t_{delay}=10\lambda$.

FIGS. 4 to 9 show the resonator shear response for sensors having various delay layer thicknesses. Graph 402 of FIG. 4 shows the resonator shear response for a sensor with no delay layer or a delay layer thickness of 0. A shear mode baseline Q factor was set at 700. A spurious mode associated with the acoustic reflector occurred at normalized frequency equal to approximately 0.75. Graph 404 of FIG. 5 shows the resonator shear response for a sensor with a delay layer thickness of 0.5λ. Graph 406 of FIG. 6 shows the resonator shear response for a sensor with a delay layer thickness of 1.5λ. Graph 408 of FIG. 7 shows the resonator shear response for a sensor with a delay layer thickness of 2λ. Graph 410 of FIG. 8 shows the resonator shear response for a sensor with a delay layer thickness of 5λ. Graph 412 of FIG. 9 shows the resonator shear response for a sensor with a delay layer thickness of 10λ. The Q factor with the delay thickness of 10λ was 1836 at the series resonant frequency of (normalized frequency equal to 1.0). The spurious mode shown in graph 402 of FIG. 4 was shown to disrupt the spacing of the multi-modes in its vicinity. The delay layer thickness of 10λ had a thickness of 21.8 micrometers.

Figure 10:
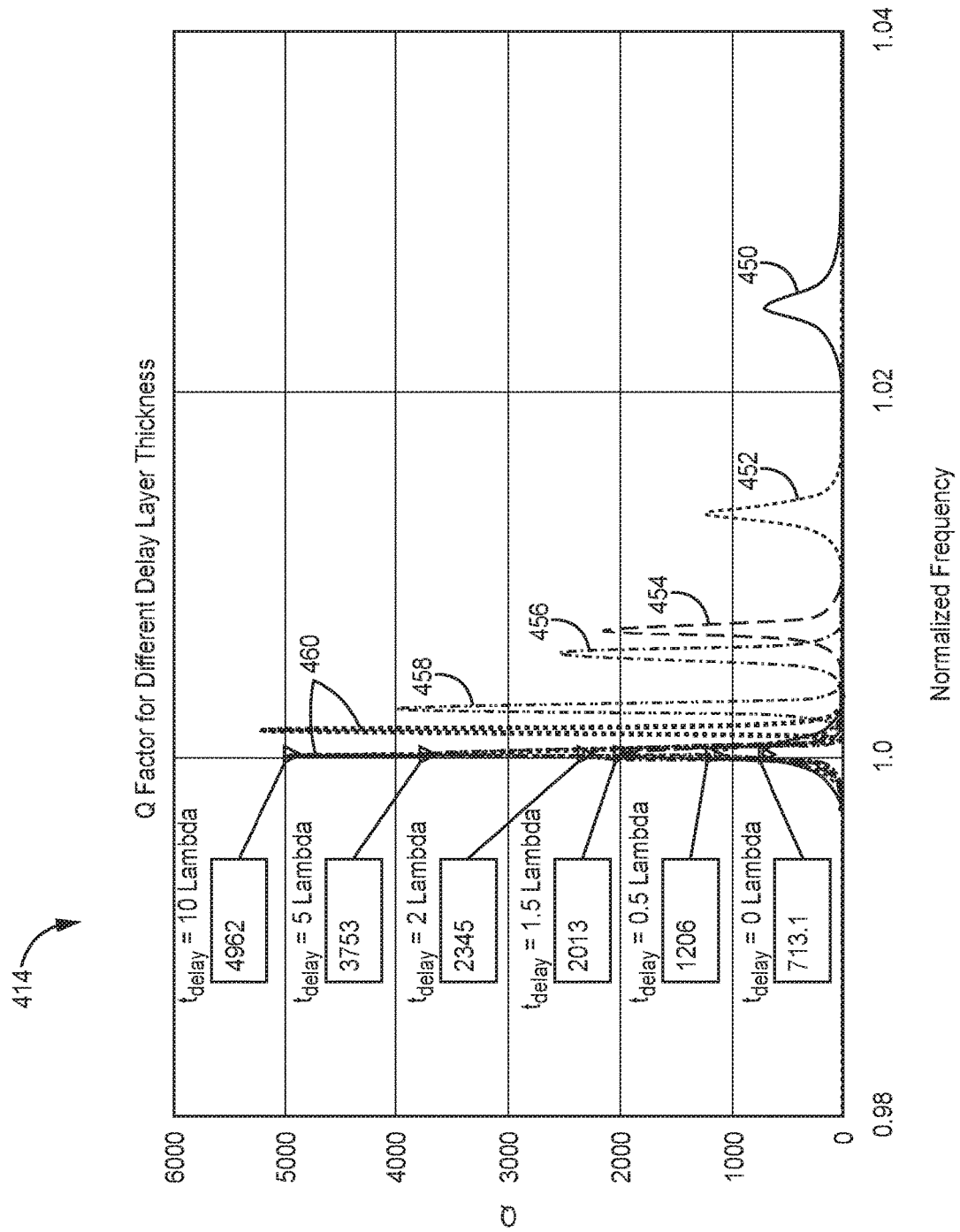
FIG. 10 is a graph of Q factor including a frequency of interest on a normalized scale for $t_{delay}=0, 0.5\lambda 1.5\lambda 2\lambda 5\lambda$, and $10\lambda$.

Graph 414 of FIG. 10 shows the Q factor responses 450, 452, 454, 456, 458, 460 for the sensors having delay layer thicknesses of 0, 0.5λ, 1.5λ, 2λ, 5λ, and 10λ, respectively. Each response 450, 452, 454, 456, 458, 460 shows a Q factor peak centered at normalized frequency equal to 1.0, which occurs at the resonance of the device, and a second peak at a higher frequency, which occurs at the anti-resonance of the device. Each response will have local maximums in Q at the resonance and anti-resonance of the device.

Figure 12:
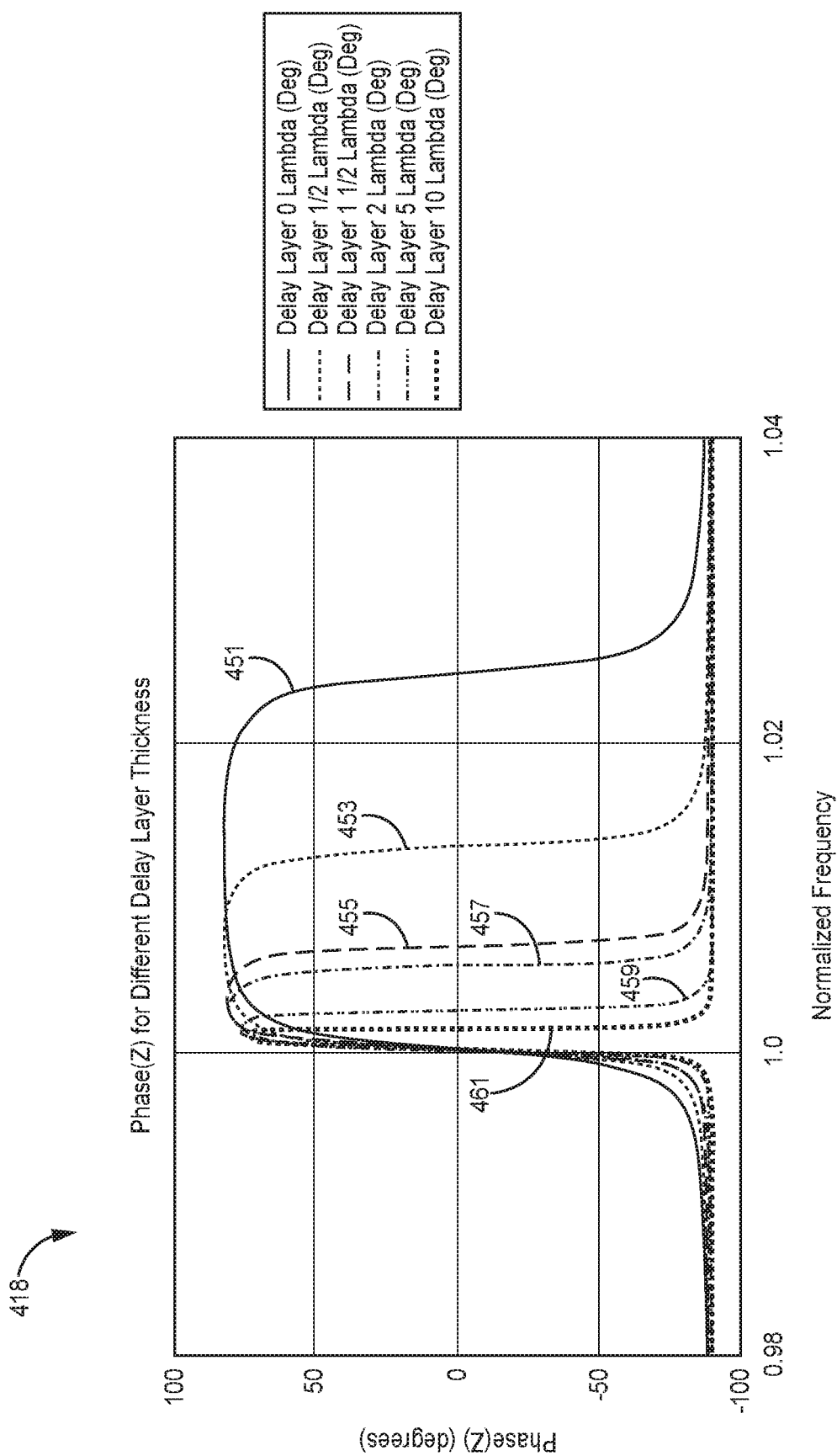
FIG. 12 is a graph of the phase response of the impedance $\varphi_z$ on a normalized scale.

Graph 418 of FIG. 12 shows the phase responses 451, 453, 455, 457, 459, 461 of the impedance $\varphi_z$ for the sensors having delay layer thicknesses of 0, 0.5λ, 1.5λ, 2λ, 5λ, and 10λ, respectively.

Figure 11:
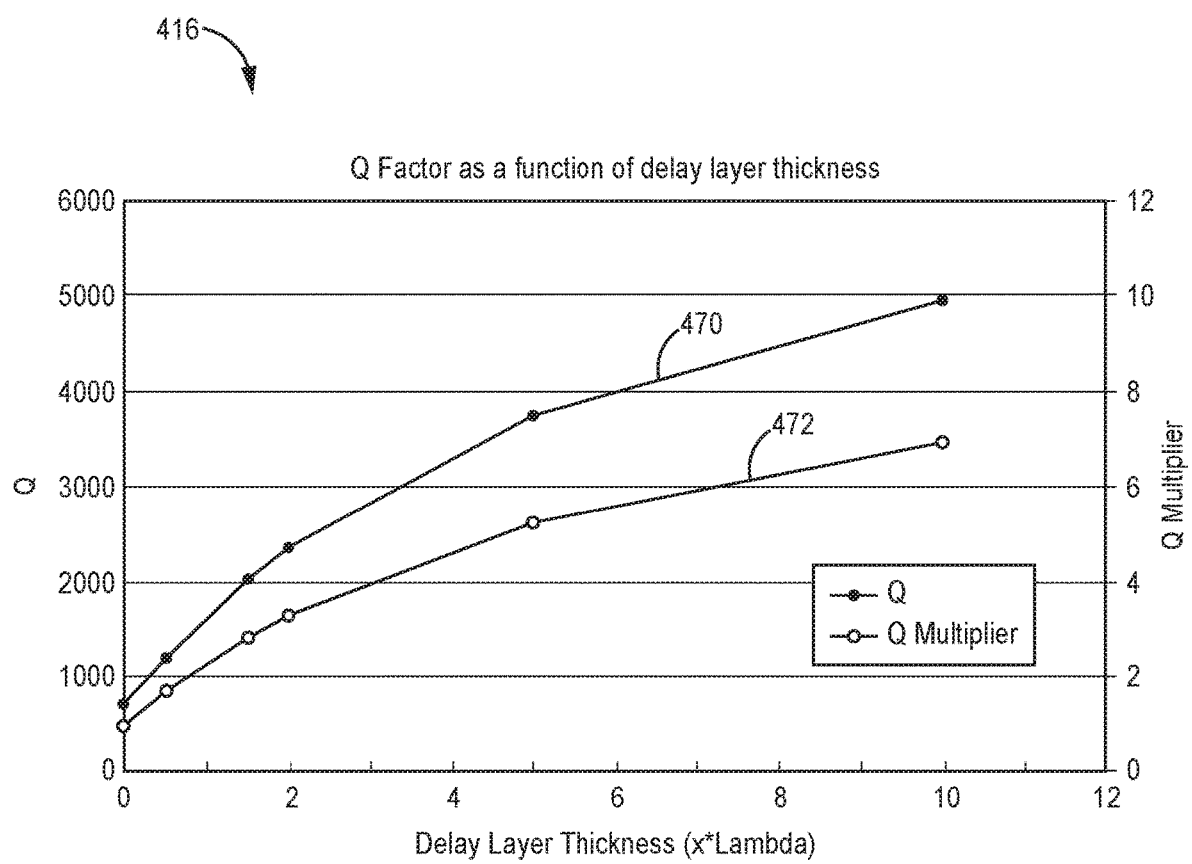
FIG. 11 is a graph of the Q factor and Q multiplication factor as a function of delay layer thickness.
Figure 13:
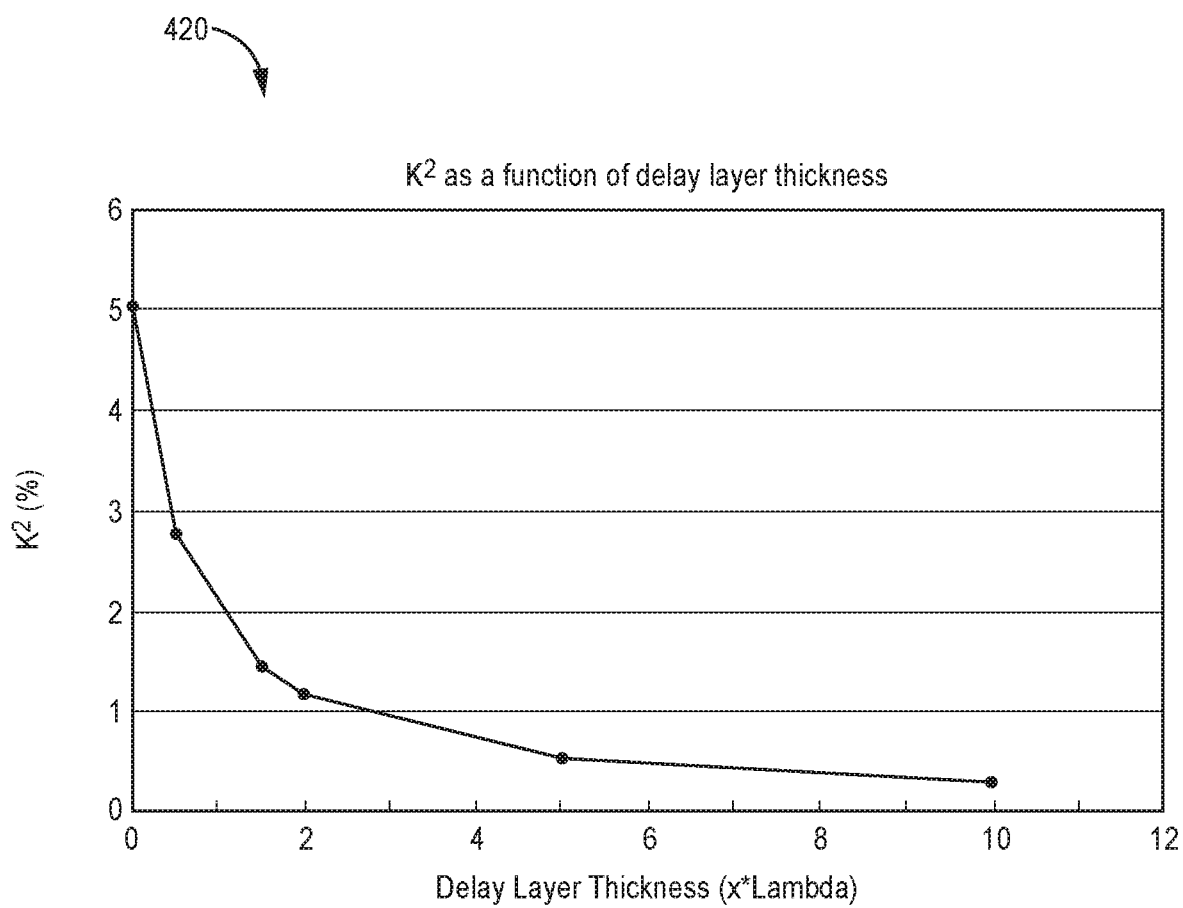
FIG. 13 is a graph of the coupling coefficient $K^2$ as a function of delay layer thickness.

A summary of the maximum Q factor at or near normalized frequency equal to 1.0 for the sensors is shown herein in Table 1. Based on Table 1, graph 416 of FIG. 11 shows the Q factor response 470 and Q multiplier response 472 as functions of delay layer thickness. In general, Q factor increases with increasing delay layer thickness. Based on Table 1, graph 420 of FIG. 13 shows the coupling coefficient $K^2$ of the sensor as a function of delay layer thickness. In general, $K^2$ diminishes with increasing delay layer thickness. At a delay layer thickness of 2λ, the coupling coefficient $K^2$ drops to about 1, or about 20% of the original value of about 5. In general, the results show that the Q factor increases when the coupling coefficient $K^2$ decreases.

TABLE 1

| Mode Number | $t_{delay}$ (λ) | $t_{delay}$ (um) | Q Factor | Q Multiplier | $K^2$ (%) |
|---|---|---|---|---|---|
| 2 | 0 | 0.00 | 713.5 | 1.0 | 5.05 |
| 3 | 0.5 | 1.09 | 1206 | 1.7 | 2.78 |
| 5 | 1.5 | 3.27 | 2013 | 2.8 | 1.45 |
| 6 | 2 | 4.37 | 2350 | 3.3 | 1.17 |
| 12 | 5 | 10.91 | 3754 | 5.3 | 0.55 |
| 22 | 10 | 21.83 | 4966 | 7.0 | 0.29 |

Example 2

In Example 2, a resonating structure was modeled as described in Example 1, except that resonating structure 601 of FIG. 15 was used, in which the acoustic delay layer 606 was placed on top of the top electrode 612 and the piezoelectric layer 610.

Example 3

In Example 3, a resonating structure was modeled as described in Example 1, except that resonating structure 701 of FIG. 16 was used, in which two acoustic delay layers 706, 707 were placed adjacent to the base resonator 703. Each acoustic delay layer 706, 707 had half the thickness of acoustic delayer layer 501 or 601.

Figure 17:
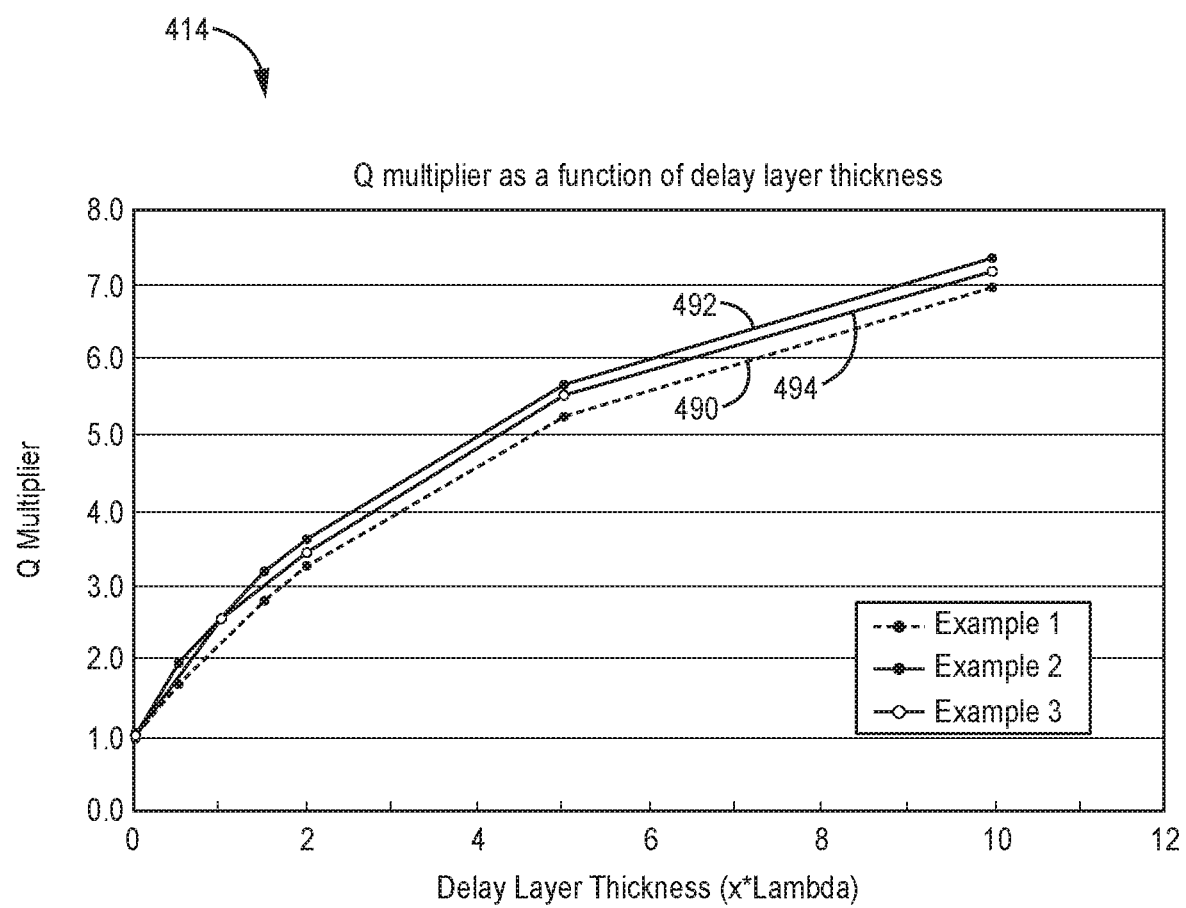
FIG. 17 is a graph of the Q factor as a function of delay layer thickness for the resonating structures of FIGS. 14, 15, and 16.

The Q factor compared to delay layer thickness was analyzed and compared to Examples 1 and 2 as shown in graph 414 of FIG. 17. The Q factor behaviors 490, 492, 494 were similar for all three variants of the resonating structure. The resonating structure of Example 2 appeared to have the highest Q factor.

Figure 18:
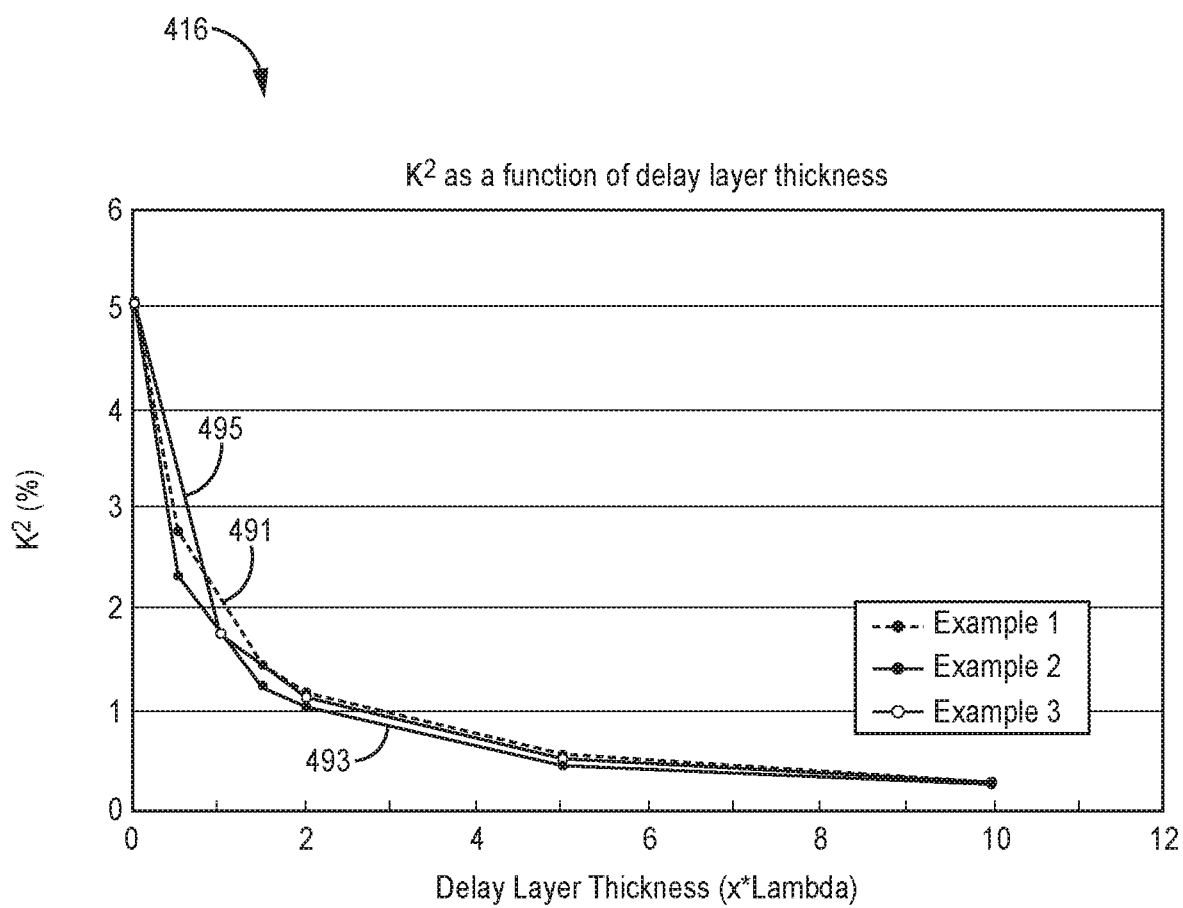
FIG. 18 is a graph of the coupling coefficient $K^2$ as a function of delay layer thickness for the resonating structures of FIGS. 14, 15, and 16.

The coupling coefficient $K^2$ versus delay layer thickness was analyzed and compared to Examples 1 and 2 as shown in graph 416 of FIG. 18. The coupling coefficient $K^2$ behaviors 491, 493, 495 were similar for all three variants of the resonating structure and generally inverse of the relationship between Q factor and delay layer thickness.

Although no surface loss effects were assumed, when the acoustic delay layer is disposed on top of the piezoelectric layer, the acoustic reflections off the delay layer in air are predicted to be nearly ideal (lossless). In liquid, however, the reflections off the delay layer are predicted to be somewhat compromised by the solid-liquid interface due to some of the shear wave energy radiating into the liquid.

Thus, various embodiments of the BULK ACOUSTIC WAVE SENSOR HAVING AN OVERMODED RESONATING STRUCTURE are disclosed. Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

All references and publications cited herein are expressly incorporated herein by reference in their entirety into this disclosure, except to the extent they may directly contradict this disclosure.

Unless otherwise indicated, all numbers expressing feature sizes, amounts, and physical properties used in the specification and claims may be understood as being modified either by the term "exactly" or "about." Accordingly, unless indicated to the contrary, the numerical parameters set forth in the foregoing specification and attached claims are approximations that can vary depending upon the desired properties sought to be obtained by those skilled in the art utilizing the teachings disclosed herein or, for example, within typical ranges of experimental error.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "at most" or "no greater than" a number (e.g., up to 50) includes the number (e.g., 50), and the term "at least" or "no less than" a number (e.g., no less than 5) includes the number (e.g., 5).

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality (for example, an electrode may be operably coupled to a piezoelectric layer to function as part of a resonator).

Terms related to orientation, such as "top" and "bottom" are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," "comprise," "comprising" or the like are used in their open-ended sense, and generally mean "including, but not limited to." It will be understood that "consisting essentially of," "consisting of," and the like are subsumed in "comprising," and the like.

The phrases "at least one of," "comprises at least one of," and "one or more of" followed by a list refers to any one of the items in the list and any combination of two or more items in the list.

What is claimed is:

1. A bulk acoustic wave sensor comprising an overmoded resonating structure, the resonating structure comprising:
   a base resonator comprising a piezoelectric layer, a first electrode disposed on a first surface of the piezoelectric layer, a second electrode disposed on a second surface of the piezoelectric layer opposite to the first side;
   an acoustic delay layer adjacent to the base resonator, wherein the acoustic delay layer defines a delay layer thickness configured to provide multiple resonance modes in the resonating structure; and
   an acoustic mirror layer adjacent to the base resonator or the acoustic delay layer.

2. The sensor of claim 1, wherein the acoustic delay layer comprises a high quality-factor material with low acoustic loss.

3. The sensor of claim 1, wherein the resonating structure defines a base resonator thickness equal to one predetermined wavelength and the delay layer thickness is a non-negative integer multiple of one half-wavelength of the predetermined wavelength.

4. The sensor of claim 3, wherein the delay layer thickness is one half-wavelength.

5. The sensor of claim 1, wherein the delay layer thickness is equal to at least 200 half-wavelengths.

6. The sensor of claim 1, wherein the delay layer thickness provides an Q multiplier factor of at least 3.

7. The sensor of claim 1, wherein the acoustic delay layer comprises: aluminum oxide, aluminum nitride, zinc oxide, silicon carbide, silicon dioxide, or carbon.

8. The sensor of claim 1, wherein the acoustic mirror layer comprises alternating layers of material.

9. The sensor of claim 1, further comprising a substrate disposed adjacent to the acoustic mirror layer opposite to the base resonator.

10. The sensor of claim 9, wherein the substrate comprises a semiconductor material.

11. The sensor of claim 1, wherein the acoustic delay layer is disposed between the base resonator and the acoustic mirror layer.

12. The sensor of claim 11, further comprising another acoustic delay layer disposed on the base resonator opposite to the acoustic mirror layer.

13. The sensor of claim 1, wherein the acoustic delay layer is disposed on the base resonator opposite to the acoustic mirror layer.

14. A sensing system comprising:
   a microfluidic channel configured to receive a sample liquid; and
   a bulk acoustic wave sensor having a surface that defines at least a portion of the microfluidic channel, the sensor comprising a resonating structure comprising:
   a base resonator comprising a first electrode, a second electrode, and a piezoelectric layer disposed between the electrodes;
   an acoustic delay layer disposed adjacent to the base resonator, wherein the acoustic delay layer defines a delay layer thickness configured to provide multiple resonance modes in the resonating structure; and
   an acoustic mirror layer disposed adjacent to the base resonator or the acoustic delay layer.

15. The sensing system of claim 14, wherein the sensor comprises an insulating layer between the microfluidic channel and the second electrode.

16. The sensing system of claim 15, further comprising a detection platform operatively coupled to the sensor to receive resonator data.

17. The sensing system of claim 16, wherein the detection platform is removably coupled to the sensor.

18. A thin-film method of making a resonating structure, the method comprising:
   providing a substrate;
   depositing an acoustic mirror layer on the substrate; and
   depositing an acoustic delay layer and a base resonator on the acoustic mirror layer in either order,
   wherein the acoustic delay layer is deposited at a thickness configured to provide multiple resonance modes in the resonating structure.

19. The sensing system of claim 15, comprising functional material disposed on the insulating layer.

20. A bulk acoustic wave sensor comprising an overmoded resonating structure, the resonating structure comprising:
   a base resonator comprising a piezoelectric layer, a first electrode disposed on a first surface of the piezoelectric layer, a second electrode disposed on a second surface of the piezoelectric layer opposite to the first side;
   an acoustic mirror layer;
   a first acoustic delay layer between the base resonator and the acoustic mirror layer; and
   a second acoustic delay layer disposed on the base resonator opposite to the acoustic mirror layer.

21. A sensing system comprising:
   a microfluidic channel configured to receive a sample liquid; and
   a bulk acoustic wave sensor having a surface that defines at least a portion of the microfluidic channel, the sensor comprising a resonating structure comprising:
   a base resonator comprising a first electrode, a second electrode, and a piezoelectric layer disposed between the electrodes;
   an acoustic mirror layer;
   a first acoustic delay layer between the base resonator and the acoustic mirror layer; and
   a second acoustic delay layer disposed on the base resonator opposite to the acoustic mirror layer.

22. A thin-film method of making a resonating structure, the method comprising:
   providing a substrate;
   depositing an acoustic mirror layer on the substrate; and depositing a first acoustic delay layer on the acoustic mirror layer;

depositing a base resonator on the first acoustic delay layer; and depositing a second acoustic delay layer on the base resonator.

* * * * *